United States Patent
Jung

(10) Patent No.: US 6,958,274 B2
(45) Date of Patent: Oct. 25, 2005

(54) METHOD OF FABRICATING SPLIT GATE FLASH MEMORY DEVICE

(75) Inventor: Jin Hyo Jung, Bucheon (KR)

(73) Assignee: DongbuAnam Semiconductor Inc., Seoul (KR)

( * ) Notice: Subject to any disclaimer, the term of this patent is extended or adjusted under 35 U.S.C. 154(b) by 0 days.

(21) Appl. No.: 11/024,724

(22) Filed: Dec. 30, 2004

(65) Prior Publication Data

US 2005/0142761 A1   Jun. 30, 2005

(30) Foreign Application Priority Data

Dec. 31, 2003   (KR) .................... 10-2003-0101769

(51) Int. Cl.$^7$ ............................................ H01L 21/336
(52) U.S. Cl. ...................... 438/261; 438/264; 438/265
(58) Field of Search ................................ 438/264, 265, 438/266, 201, 211, 257, 261, 593

(56) References Cited

U.S. PATENT DOCUMENTS

| | | | | |
|---|---|---|---|---|
| 5,879,992 | A * | 3/1999 | Hsieh et al. | 438/264 |
| 6,017,795 | A * | 1/2000 | Hsieh et al. | 438/262 |
| 6,130,132 | A * | 10/2000 | Hsieh et al. | 438/264 |
| 6,174,772 | B1 * | 1/2001 | Hsieh et al. | 438/264 |
| 6,200,859 | B1 * | 3/2001 | Huang et al. | 438/264 |
| 6,200,860 | B1 * | 3/2001 | Chiang et al. | 438/266 |
| 6,380,030 | B1 * | 4/2002 | Chen et al. | 438/257 |
| 6,441,429 | B1 * | 8/2002 | Hsieh et al. | 257/316 |
| 6,465,841 | B1 * | 10/2002 | Hsieh et al. | 257/321 |
| 6,468,863 | B2 * | 10/2002 | Hsieh et al. | 438/261 |
| 6,706,601 | B1 * | 3/2004 | Liu et al. | 438/266 |
| 6,828,183 | B1 * | 12/2004 | Sung et al. | 438/201 |
| 2002/0110972 | A1 * | 8/2002 | Chen et al. | 438/201 |

* cited by examiner

*Primary Examiner*—Olik Chaudhuri
*Assistant Examiner*—Lex H. Malsawma
(74) *Attorney, Agent, or Firm*—Oblon, Spivak, McClelland, Maier & Neustadt, P.C.

(57) ABSTRACT

A method of fabricating a split gate flash memory device by which stringer generation is prevented. The method includes forming a first gate pattern covered with a cap layer on a semiconductor substrate in an active area, and forming an etchant-resistant layer covering one side of the first gate pattern, the etchant-resistant layer extending to a surface of the substrate to cover one confronting side of a neighboring first gate pattern in the active area. The method also includes forming an insulating layer on an exposed surface of the first gate pattern, and forming a second gate pattern covering the first gate pattern and the insulating layer, the second gate pattern not overlapping the etch-resistant layer. The method further includes removing the etch-resistant layer, and forming a pair of doped regions in the substrate aligned with the first and second gate patterns.

20 Claims, 6 Drawing Sheets

METHOD OF FABRICATING SPLIT GATE FLASH MEMORY DEVICE

BACKGROUND OF THE INVENTION

1. Field of the Invention

The present invention relates to a method of fabricating a split gate flash memory device.

2. Discussion of the Related Art

Generally, a flash memory device, which is a non-volatile memory device capable of maintaining information stored in its memory cell without a power supply, is mounted on a circuit board to enable high-speed electrical erasures.

Flash memory technology keeps evolving in a manner of modifying cell structures variously. The various cells can be classified into a stacked gate cell, a split gate cell, and the like.

In the stacked gate cell, a floating gate and a control gate are sequentially stacked. Yet, the stacked gate cell has a problem of over-erasing. The over-erasing takes place when the floating gate is over-discharged. A threshold voltage of the over-discharged cell shows a negative value. Even if the cell is not selected, i.e., even if a read voltage is not applied to the control gate, a current flow takes place. To overcome the over-erase problem, a split gate cell structure has been proposed.

A method of fabricating a split gate flash memory device according to a related art is explained as follows.

FIGS. 1A to 1D are cross-sectional diagrams for explaining a method of fabricating a split gate flash memory device according to a related art.

Referring to FIG. 1A, an ONO (oxide-nitride-oxide) layer 102, a first conductor layer, an oxide layer 104, and a nitride layer 105 are sequentially stacked on a semiconductor substrate 101. The nitride layer 105, the oxide layer 104, and the conductor layer are patterned to form a first gate pattern 103. Annealing is carried out on the substrate 101 to grow thermal oxide layers 106 on left and right sidewalls of the first gate pattern 103.

Referring to FIG. 1B, an exposed portion of the ONO layer 102 failing to be covered with the first gate pattern 103 is etched away. A gate oxide layer 107 is grown on an exposed surface of the substrate by thermal oxidation. A second conductor layer 108 is then deposited over the substrate including the first gate pattern 103.

Referring to FIG. 1C, the second conductor layer 108 is selectively patterned to remain on one side of the first gate pattern 103. Hence, a second gate pattern 108a is formed on one side of the first gate pattern 103 to complete a split gate constructed with the first and second gate patterns 103 and 108a. A thermal oxide layer 109 is formed on a surface of the second gate pattern 108a. Ion implantation is lightly carried out on the substrate 101 to form lightly doped regions n− for an LDD (lightly doped drain) structure in the substrate below both sides of the split gate, respectively.

Referring to FIG. 1D, a spacer 110 is formed on a sidewall of the second gate pattern 108a. Ion implantation is heavily carried out on the substrate to form heavily doped regions n+ for a source and drain in the substrate adjacent to the lightly doped regions, respectively. A pair of symmetrical split gates is formed in a memory cell area by the related art method. Since the first gate pattern, the oxide layer and the nitride layer are stacked on a pair of prescribed portions of the substrate in depositing the second conductor layer for the second gate patterns of the split gates, a recess is provided between a pair of split gate areas due to the step difference of the first gate pattern, oxide layer and nitride layer.

In forming the second gate patterns by patterning the second conductor layer, a portion of the second conductor layer between a pair of the split gate areas is incompletely etched whereas the other portion of the split gate areas is completely removed.

Specifically, a polymer is generated as an etch residue when the second conductor layer is selectively removed by wet etch. The polymer is accumulated between the first gate patterns and prevents an etchant gas from being sufficiently supplied to the space between a pair of the split gates. This prevents completion of the etching process.

As a result, stringers 120 in FIG. 3 are generated in the space between a pair of the split gate areas. The space between a pair of the split gate areas corresponds to a portion where a contact hole for connection to an upper line will be formed. Hence, the stringers degrade electrical characteristics such as contact resistance and the like.

In the related art method, the thickness of the insulating layer stacked on the first gate pattern is decreased to suppress the generation of the stringers. However, if the thickness of the insulating layer stacked on the first gate pattern is decreased, parasitic capacitance between the first and second gate patterns is increased.

SUMMARY OF THE INVENTION

Accordingly, the present invention is directed to a method of fabricating a split gate flash memory device that substantially obviates one or more problems due to limitations and disadvantages of the related art.

The present invention advantageously provides a method of fabricating a split gate flash memory device by which stringers are prevented from remaining between a pair of split gates.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, a method of fabricating a split gate flash memory device according to the present invention includes the steps of forming a pair of first gate patterns on a semiconductor substrate in an active area at a prescribed distance from each other, forming an etch-resistant layer pattern covering confronting sidewalls of the pair of the first gate patterns and a surface of the substrate corresponding to the prescribed distance, forming an insulating layer on exposed surfaces of the pair of first gate patterns, forming a pair of second gate patterns over the pair of first gate patterns, each respectively not overlapping with the etch-resistant layer, removing the etch-resistant layer, and forming doped regions in the substrate aligned with the pair of first and second gate patterns, respectively.

In an exemplary embodiment, each of the first gate patterns is formed covered with a cap layer.

In an exemplary embodiment, the cap layer comprises an oxide layer and a nitride layer.

In an exemplary embodiment, the second gate patterns are formed by carrying out anisotropic etching on a conductor layer deposited over the substrate including the etch-resistant layer and the first gate patterns.

In an exemplary embodiment, the etch-resistant layer is formed of either oxide or nitride.

In an exemplary embodiment, the etch-resistant layer is removed by wet etch.

In an exemplary embodiment, the doped regions forming step includes the steps of forming lightly doped regions in the substrate to be aligned with a pair of the first and second gate patterns, respectively, forming spacers on sidewalls of a pair of the first and second gates, respectively, and forming heavily doped regions in the substrate to be aligned with the spacers, respectively.

In another aspect of the present invention, a method of fabricating a split gate flash memory device includes the steps of forming a first gate pattern covered with a cap layer on a semiconductor substrate in an active area, forming an etchant-resistant layer covering one side of the first gate pattern, the etchant-resistant layer extending to a surface of the substrate to cover one confronting side of a neighboring first gate pattern in the active area, forming an insulating layer on an exposed surface of the first gate pattern, forming a second gate pattern covering the first gate pattern and the insulating layer not overlapping the etch-resistant layer, removing the etch-resistant layer, and forming a pair of doped regions in the substrate aligned with the first and second gate patterns.

In an exemplary embodiment, the cap layer comprises an oxide layer and a nitride layer.

In an exemplary embodiment, the second gate pattern is formed by carrying out anisotropic etching on a conductor layer deposited over the substrate including the etch-resistant layer and the first gate pattern.

In an exemplary embodiment, the etch-resistant layer is formed of either oxide or nitride.

In an exemplary embodiment, the etch-resistant layer is removed by wet etch.

In an exemplary embodiment, the doped regions forming step further includes the steps of forming lightly doped regions in the substrate aligned with the first and second gate patterns, forming spacers on sidewalls of the first and second gates, respectively, and forming heavily doped regions in the substrate to be aligned with the spacers, respectively.

It is to be understood that both the foregoing general description and the following detailed description of the present invention are exemplary, but are not restrictive of the invention.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

DETAILED DESCRIPTION OF THE INVENTION

Reference will now be made in detail to exemplary embodiments of the present invention, which are illustrated in the accompanying drawings. Wherever possible, the same reference numbers will be used throughout the drawings to refer to the same or like parts.

FIGS. 2A to 2E are cross-sectional diagrams for explaining a method of fabricating a split gate flash memory device according to the present invention.

Figure 1A:
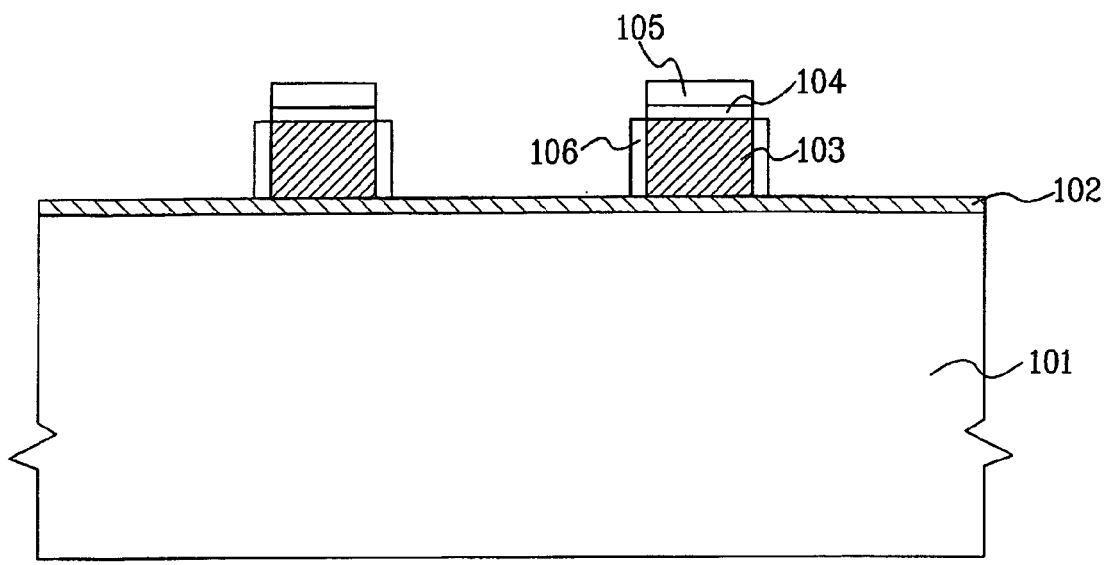
FIGS. 1A to 1D are cross-sectional diagrams for explaining a method of fabricating a split gate flash memory device according to a related art.
Figure 1B:
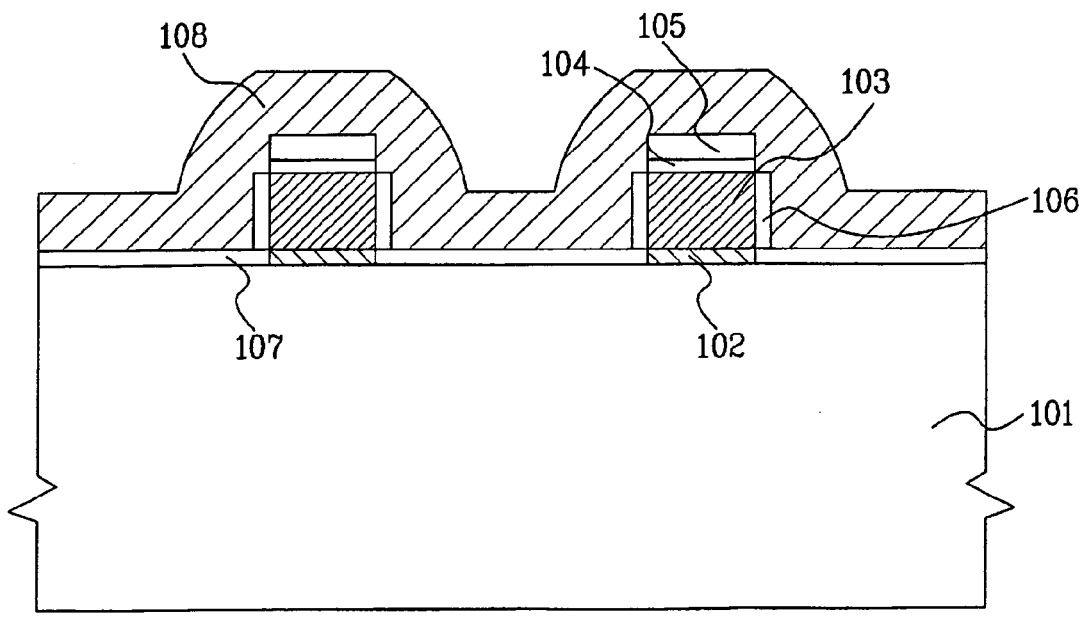
Figure 1C:
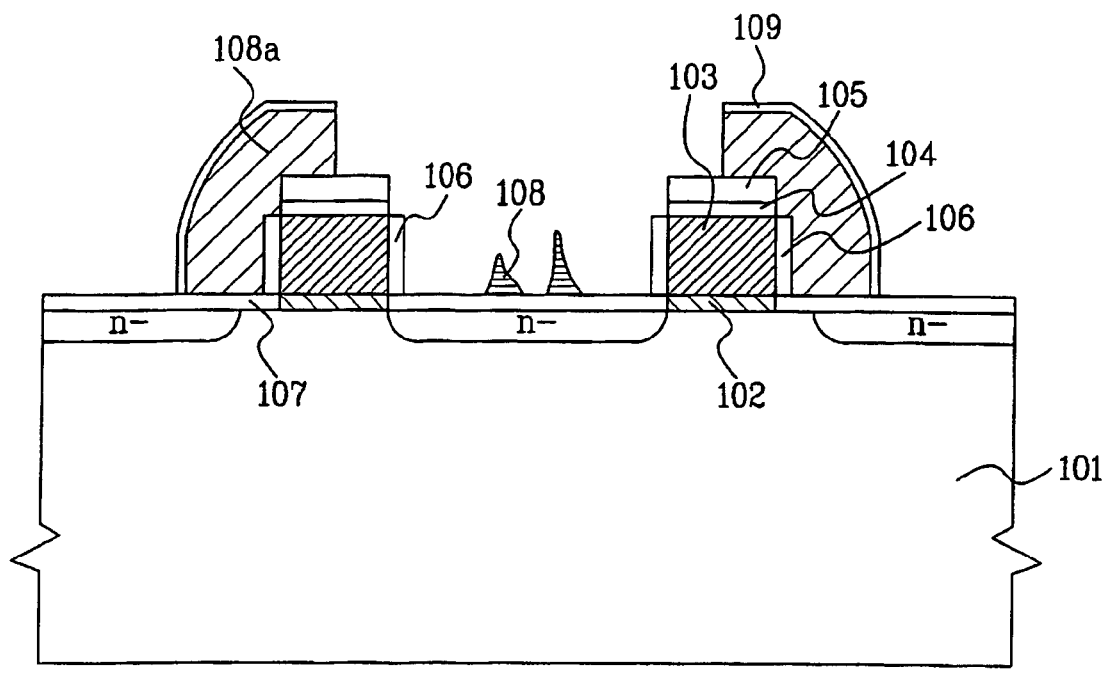
Figure 1D:
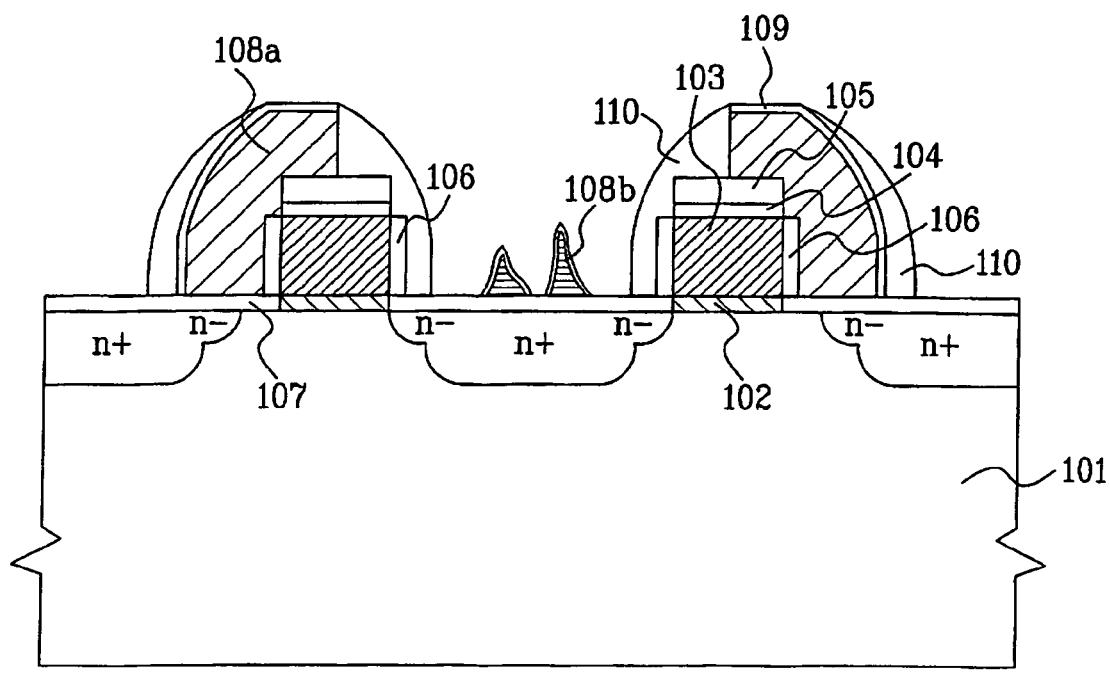
Figure 2A:
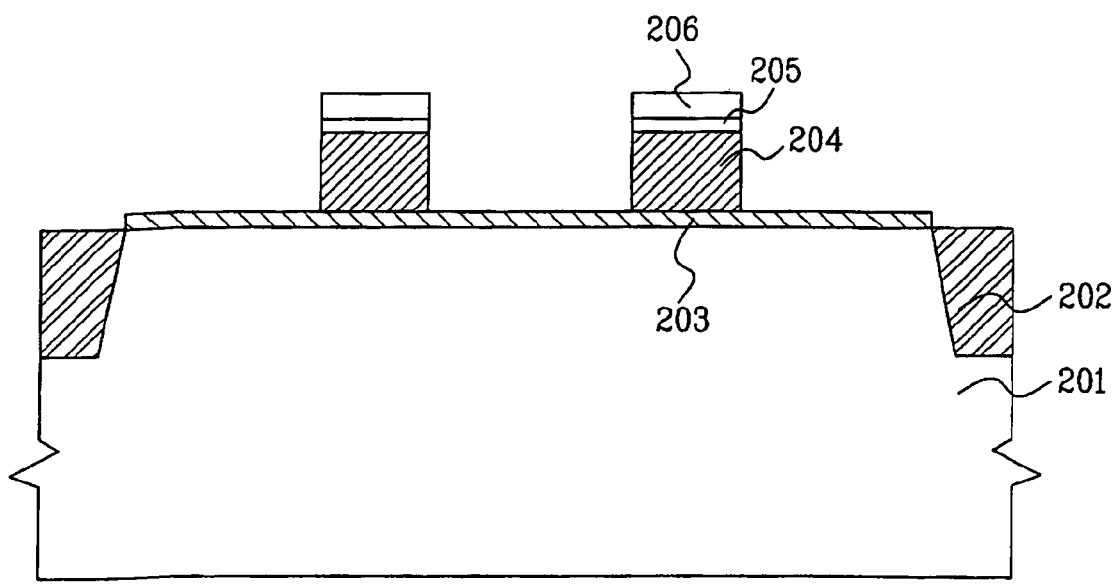
FIGS. 2A to 2E are cross-sectional diagrams for explaining a method of fabricating a split gate flash memory device according to the present invention.

Referring to FIG. 2A, a device isolation layer 202 is formed on a semiconductor substrate 201 formed of single crystalline silicon or the like. The device isolation layer 202 is formed by an isolation process such as STI (shallow trench isolation) to define an active area on the substrate 201. A dielectric layer 203 is formed on the substrate 201. The dielectric layer 203 may have an oxide-nitride-oxide structure.

A first conductor layer and an insulating layer are sequentially stacked on the dielectric layer 203. The first conductor layer may be formed of polysilicon. The insulating layer may include a double layer consisting of an oxide layer 205 and a nitride layer 206.

After a photoresist layer has been coated on the insulating layer, exposure and development are carried out on the photoresist layer to form a photoresist pattern (not shown in the drawing) defining a first gate pattern area. The insulating layer and the first conductor layer are sequentially etched using the photoresist pattern as an etch mask to form a first gate pattern 204 covered with an insulating layer pattern. A neighboring first gate pattern 204 having a symmetric structure to the first gate pattern 204 is simultaneously formed on the same active area of the dielectric layer 203 a prescribed distance away. The photoresist pattern is then removed.

Figure 2B:
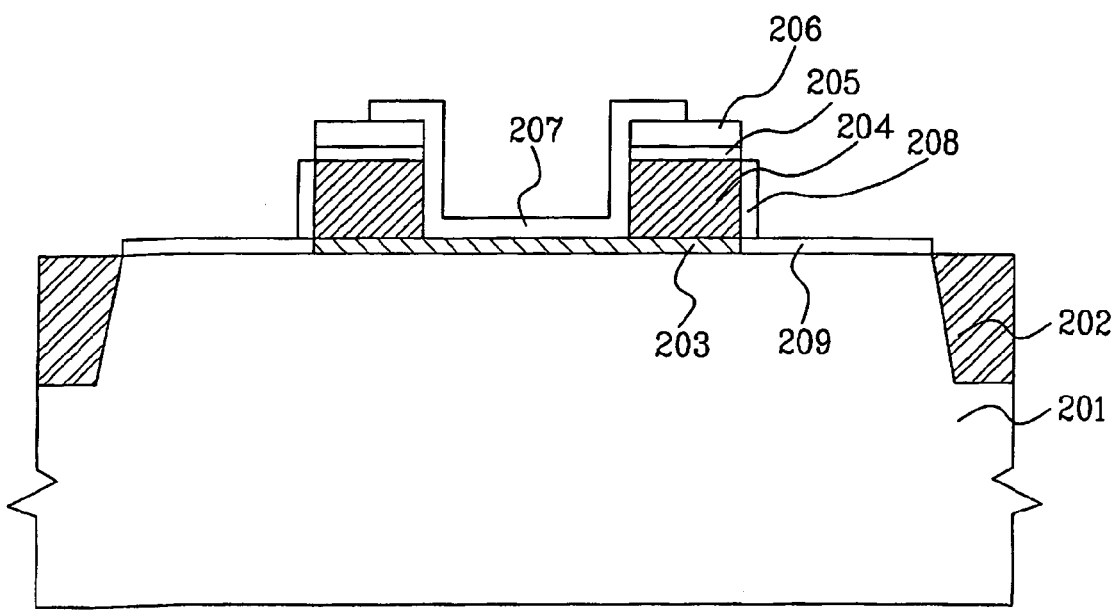

Referring to FIG. 2B, an etch-resistant layer is formed over the substrate 201 including the first gate pattern 204 and the neighboring first gate pattern. The etch-resistant layer is formed of an oxide or nitride layer.

The etch-resistant layer is partially removed by photolithography to form an etch resistant layer pattern 207. In doing so, the etch-resistant layer pattern 207 remains on the space between the first gate pattern 204 and the neighboring first gate pattern and further extends to overlap portions of the first gate pattern 204 and the neighboring first gate pattern. Hence, the non-overlapped portions of the first gate pattern 204 and the neighboring first gate pattern are exposed. The exposed area corresponds to a second gate pattern area and a neighboring second gate pattern area.

Annealing is then carried out on the substrate to grow a thermal oxide layer 208 on the exposed portions of the first gate pattern 204 and the neighboring gate pattern. The insulating layer on the first gate pattern 204 and the thermal oxide layer 208 on a sidewall of the first gate pattern 204 will be located between the first gate pattern and a second gate pattern that will be formed. The insulating layer and the thermal oxide layer will play a role in reducing parasitic capacitance between the first and second gate patterns. Simultaneously, the same structure is symmetrically provided to the neighboring first gate pattern.

Figure 2C:
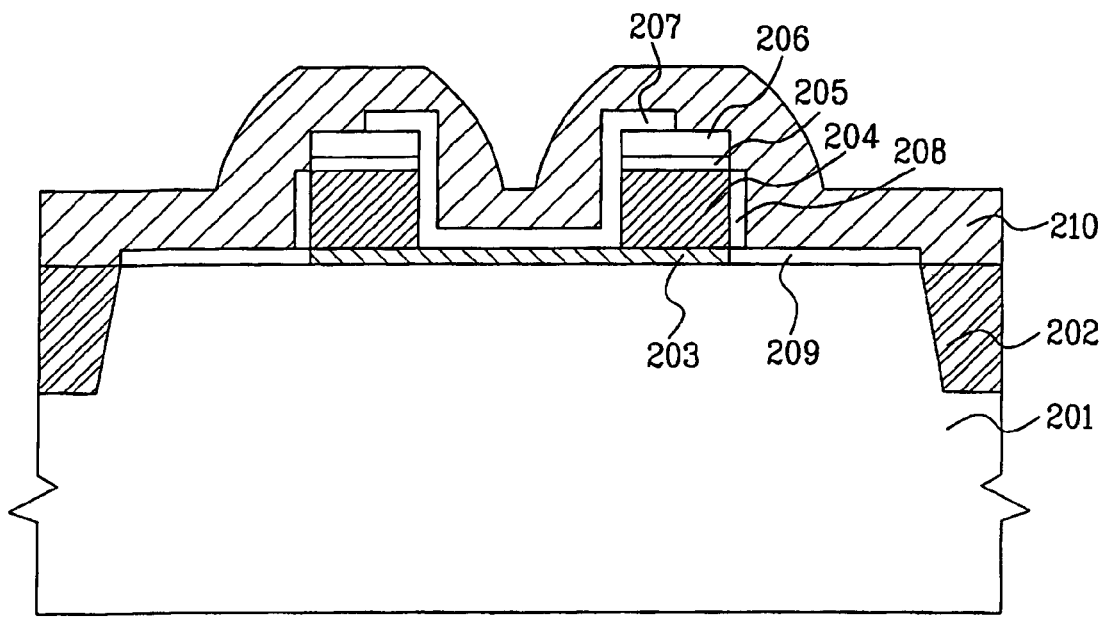

Referring to FIG. 2C, the dielectric layer 203 not covered with the first gate pattern, the neighboring first gate pattern, and the etchant-resistant layer pattern 207 are etched away. Hence, a dielectric layer pattern 203 only remains beneath the first gate pattern, the neighboring first gate pattern, and the etchant-resistant layer pattern 207. A surface of the substrate not covered with the dielectric layer pattern 203 in the active area is exposed. A gate oxide layer 209 is formed on the exposed surface of the substrate in the active area by thermal oxidation.

A second conductor layer 210 for a second gate pattern and a neighboring second gate pattern is deposited over the substrate 201 including the first gate pattern 204 and the neighboring first gate pattern. The second conductor layer 210 deposited in the space between the pair of split gate areas, i.e., between the first gate pattern 204 and the neighboring gate pattern, has a gentle slope attributed to a thickness of the etchant-resistant layer 207.

Figure 2D:
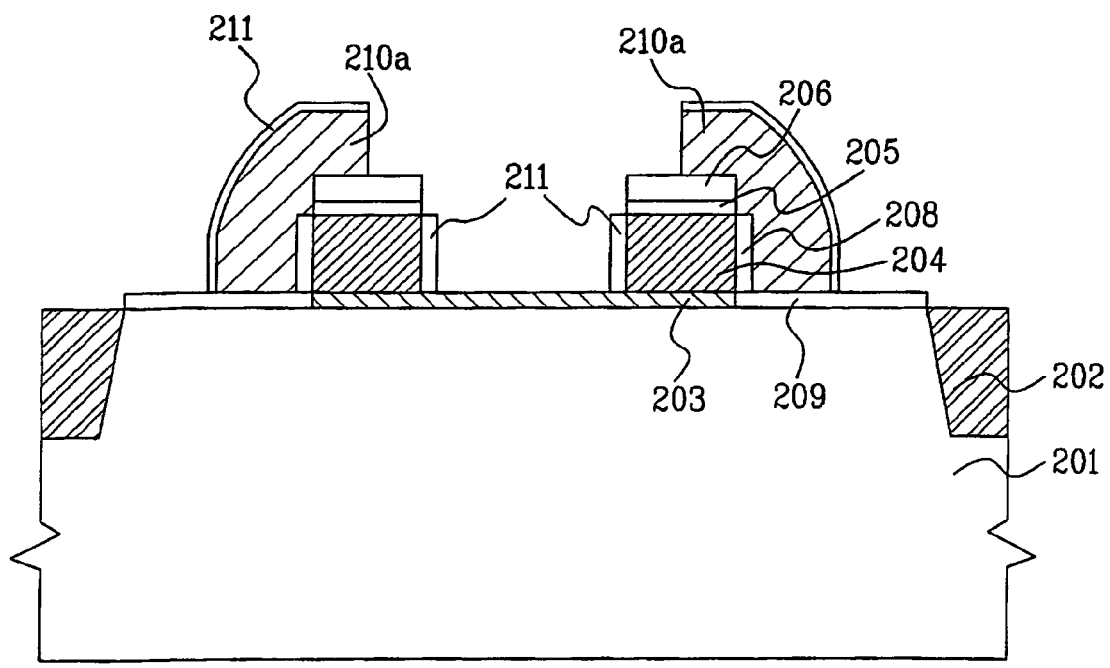

Referring to FIG. 2D, the second conductor layer 210 is selectively patterned to remain on the second gate pattern area and a neighboring second gate pattern area to form a second gate pattern 210a and a neighboring second gate pattern 210a symmetric to the second gate pattern 210a. Since the second conductor layer 210 deposited between the first gate pattern 204 and the neighboring gate pattern has a smooth slope, an etchant gas is sufficiently provided to the space between the pair of split gate areas in etching the second conductor layer 210 to suppress the stringer generation in the this area. In case stringers are generated in the space between the pair of split gate areas, over-etching may be further carried out on the substrate to remove the generated stringers. The etch-resistant layer pattern 207 under the stringers enables the substrate 201 from being damaged by the over-etching. The etch-resistant layer 207 is then removed by wet etch using HF or the like.

A thermal oxide layer is formed on a surface of the second gate pattern 210a and a sidewall of the first gate pattern 204 having the etch-resistant layer removed by thermal oxidation. Hence, a split gate including the first and second gate patterns 204 and 210a is completed. Of course, the other split gate including the neighboring first and second gate patterns having a symmetric structure to the former split gate is simultaneously provided to the other split gate area.

Figure 2E:
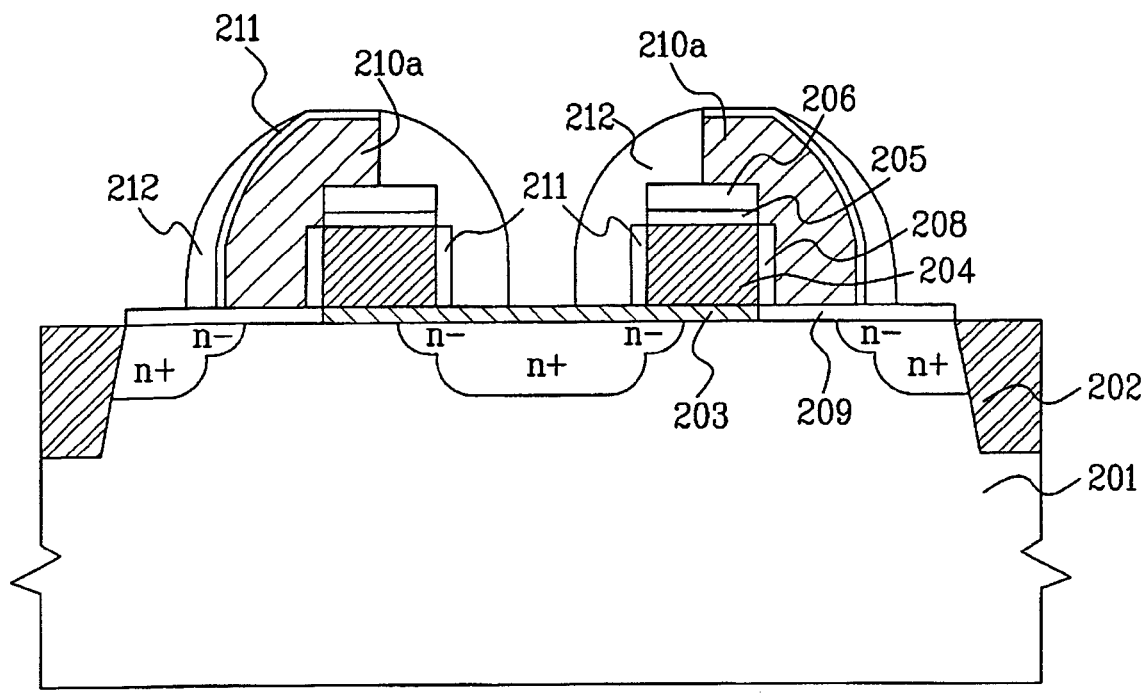
Figure 3:
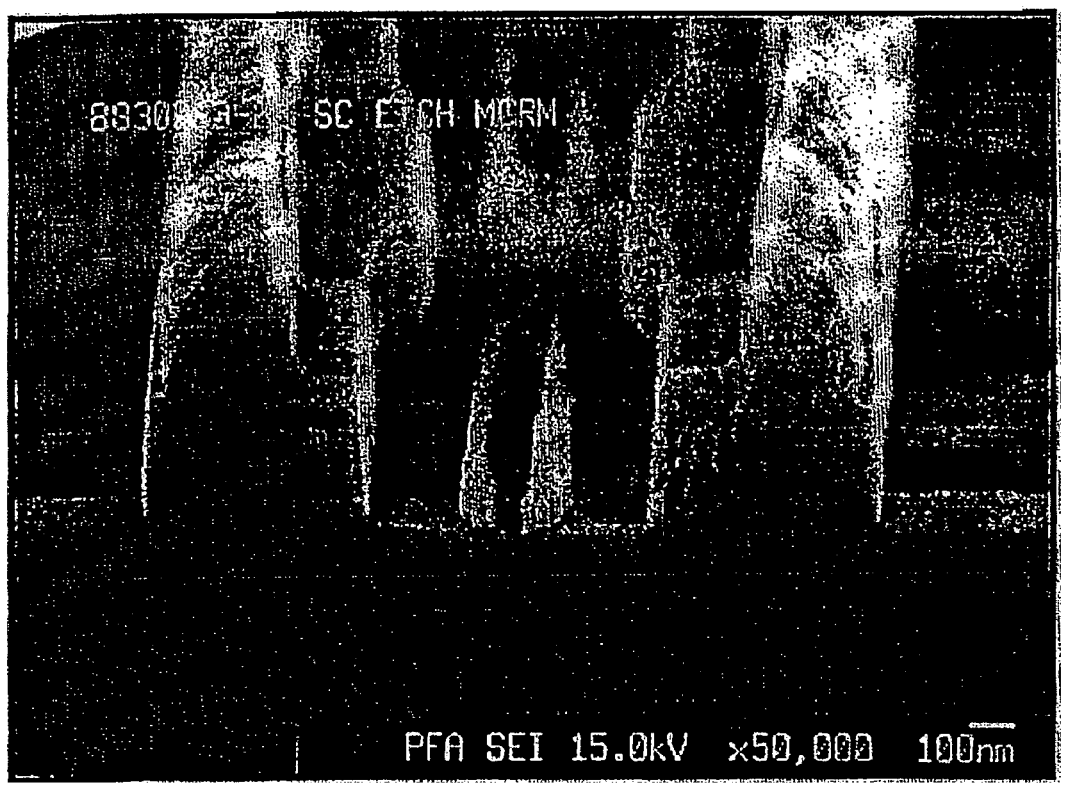
FIG. 3 is a SEM picture of a split gate flash memory device according to a related art, in which stringers are shown.

Referring to FIG. 2E, LDD ion implantation is carried out on the substrate 201 to form lightly doped regions n– for LDD structures aligned with each of the split gates. An oxide layer and a nitride layer are sequentially stacked over the substrate 201 including the split gates and are then anisotropically etched to from spacers 212 on sidewalls of the split gates, respectively. Heavy ion implantation is carried out on the substrate 201 to form heavily doped regions n+ for sources and drains of the split gates.

Thereafter, an insulating interlayer (not shown in the drawing) is deposited over the substrate 201 including the split gates. The insulating layer is selectively etched to form a contact hole exposing the space between the pair of split gates. Since the stringers are not generated in the space between the pair of split gates, contact resistance is not degraded.

Accordingly, in the present invention, the etchant-resistant layer is formed to lower the step difference of the second conductor layer of the second gate pattern, whereby the stringers are prevented from forming in the space between the pair of split gate areas. Moreover, even if the stringers are generated, the etchant-resistant layer can prevent the substrate from being damaged by the over-etch for removing the stringers.

Therefore, the present invention prevents the stringers in the space between the pair of split gate areas, thereby enhancing electrical characteristics of the memory device.

Korean Patent Application No. P2003-0101769, filed on Dec. 31, 2003, is hereby incorporated by reference in its entirety.

It will be apparent to those skilled in the art that various modifications and variations can be made in the present invention. Thus, it is intended that the present invention covers the modifications and variations of this invention within the scope of the appended claims and their equivalents.

What is claimed is:

1. A method of fabricating a split gate flash memory device, comprising the steps of:
   forming a pair of first gate patterns on a semiconductor substrate in an active area a prescribed distance from each other;
   forming an etch-resistant layer pattern covering confronting sidewalls of the pair of first gate patterns and covering a surface of the substrate corresponding to the prescribed distance;
   forming an insulating layer on exposed surfaces of the pair of first gates;
   forming a pair of second gate patterns over the pair of first gate patterns, respectively, not overlapping the etch-resistant layer;
   removing the etch-resistant layer; and
   forming doped regions in the substrate aligned with the pair of first and second gate patterns, respectively.

2. The method of claim 1, wherein the step of forming a pair of first gate patterns includes a step of forming a cap layer covering each of the pair of first gate patterns.

3. The method of claim 2, wherein the step of forming a cap layer includes forming the cap layer of an oxide layer and a nitride layer.

4. The method of claim 1, wherein the step of forming a pair of second gate patterns includes anisotropic etching a conductor layer deposited over the substrate including the etch-resistant layer and the first gate patterns.

5. The method of claim 1, wherein the step of forming an etch-resistant layer includes forming the etch-resistant layer of oxide or nitride.

6. The method of claim 1, wherein the step of removing the etch-resistant layer includes removing the etch-resistant layer by wet etching.

7. The method of claim 1, wherein the step of forming doped regions includes the steps of:
   forming lightly doped regions in the substrate aligned with the pair of first and second gate patterns, respectively;
   forming spacers on sidewalls of the pair of the first and second gate patterns, respectively; and
   forming heavily doped regions in the substrate aligned with the spacers, respectively.

8. A method of fabricating a split gate flash memory device, comprising the steps of:
   forming a first gate pattern covered with a cap layer on a semiconductor substrate in an active area;
   forming an etchant-resistant layer covering one side of the first gate pattern, the etchant-resistant layer extending to a surface of the substrate to cover one confronting side of a neighboring first gate pattern in the active area;
   forming an insulating layer on an exposed surface of the first gate pattern;
   forming a second gate pattern covering the first gate pattern and the insulating layer, the second gate pattern not overlapping the etch-resistant layer;
   removing the etch-resistant layer; and
   forming a pair of doped regions in the substrate aligned with the first and second gate patterns.

9. The method of claim 8, wherein the step of forming a first gate pattern with a cap layer includes forming the cap layer of an oxide layer and a nitride layer.

10. The method of claim 8, wherein the step of forming a second gate pattern includes anisotropic etching a conductor layer deposited over the substrate including the etch-resistant layer and the first gate pattern.

11. The method of claim 8, wherein the step of forming an etch-resistant layer includes forming the etch-resistant layer of oxide or nitride.

12. The method of claim 8, wherein the step of removing an etch-resistant layer includes removing the etch-resistant layer by wet etch.

13. The method of claim 8, wherein the step of forming doped regions includes the steps of:
    forming lightly doped regions in the substrate aligned with the first and second gate patterns;
    forming spacers on sidewalls of the first and second gates, respectively; and
    forming heavily doped regions in the substrate aligned with the spacers, respectively.

14. A method of fabricating a split gate flash memory device comprising:
    a step for forming a pair of first gate patterns on a semiconductor substrate in an active area a prescribed distance from each other;
    a step for forming an etch-resistant layer pattern covering confronting sidewalls of the pair of first gate patterns and covering a surface of the substrate corresponding to the prescribed distance;
    a step for forming an insulating layer on exposed surfaces of the pair of first gates;
    a step for forming a pair of second gate patterns over the pair of first gate patterns, respectively, not overlapping the etch-resistant layer;
    a step for removing the etch-resistant layer; and
    a step for forming doped regions in the substrate aligned with the pair of first and second gate patterns, respectively.

15. The method of claim 14, wherein the step for forming a pair of first gate patterns includes a step for forming a cap layer covering each of the pair of first gate patterns.

16. The method of claim 15, wherein the step for forming a cap layer includes a step for forming the cap layer of an oxide layer and a nitride layer.

17. The method of claim 14, wherein the step for forming a pair of second gate patterns includes a step for anisotropic etching a conductor layer deposited over the substrate including the etch-resistant layer and the first gate patterns.

18. The method of claim 14, wherein the step for forming an etch-resistant layer includes a step for forming the etch-resistant layer of oxide or nitride.

19. The method of claim 14, wherein the step for removing the etch-resistant layer includes a step for removing the etch-resistant layer by wet etching.

20. The method of claim 14, wherein the step for forming doped regions includes:
    a step for forming lightly doped regions in the substrate aligned with the pair of first and second gate patterns, respectively;
    a step for forming spacers on sidewalls of the pair of the first and second gate patterns, respectively; and
    a step for forming heavily doped regions in the substrate aligned with the spacers, respectively.

* * * * *